(12) United States Patent
Namie et al.

(10) Patent No.: US 10,308,752 B2
(45) Date of Patent: *Jun. 4, 2019

(54) BLOCK COPOLYMER

(71) Applicant: JSR CORPORATION, Tokyo (JP)

(72) Inventors: Yuji Namie, Tokyo (JP); Shinya Minegishi, Tokyo (JP); Tomoki Nagai, Tokyo (JP); Takuo Sone, Tokyo (JP)

(73) Assignee: JSR CORPORATION, Tokyo (JP)

( * ) Notice: Subject to any disclaimer, the term of this patent is extended or adjusted under 35 U.S.C. 154(b) by 84 days.

This patent is subject to a terminal disclaimer.

(21) Appl. No.: 15/479,705

(22) Filed: Apr. 5, 2017

(65) Prior Publication Data

US 2017/0204216 A1 Jul. 20, 2017

Related U.S. Application Data

(63) Continuation of application No. 14/272,587, filed on May 8, 2014, now Pat. No. 9,684,235, which is a continuation of application No. PCT/JP2012/078394, filed on Nov. 1, 2012.

(30) Foreign Application Priority Data

Nov. 9, 2011 (JP) .................. 2011-245991
Aug. 16, 2012 (JP) .................. 2012-180689

(51) Int. Cl.
*C08F 297/02* (2006.01)
*H01L 21/033* (2006.01)
*G03F 7/00* (2006.01)
*H01L 21/308* (2006.01)
*H01L 21/3213* (2006.01)
*B81C 1/00* (2006.01)
*C08L 53/00* (2006.01)
*G03F 7/20* (2006.01)
*H01L 21/027* (2006.01)

(52) U.S. Cl.
CPC ...... *C08F 297/026* (2013.01); *B81C 1/00031* (2013.01); *C08L 53/005* (2013.01); *G03F 7/0002* (2013.01); *G03F 7/0035* (2013.01); *G03F 7/70* (2013.01); *H01L 21/0273* (2013.01); *H01L 21/0337* (2013.01); *H01L 21/3086* (2013.01); *H01L 21/32139* (2013.01); *B81C 2201/0149* (2013.01)

(58) Field of Classification Search
CPC .................................. C08F 297/026
See application file for complete search history.

(56) References Cited

U.S. PATENT DOCUMENTS

| 5,391,628 A | 2/1995 | Gaillard et al. |
| 7,521,090 B1 | 4/2009 | Cheng et al. |
| 9,684,235 B2 * | 6/2017 | Namie ............... H01L 21/0337 |
| 2001/0024684 A1 | 9/2001 | Steiner et al. |
| 2003/0158336 A1 | 8/2003 | Yaguchi et al. |
| 2008/0038467 A1 | 2/2008 | Jagannathan et al. |
| 2008/0318005 A1 | 12/2008 | Millward |
| 2009/0214823 A1 | 8/2009 | Cheng et al. |
| 2010/0241071 A1 | 9/2010 | Atanasoska |
| 2012/0116007 A1 | 5/2012 | Gopalan et al. |
| 2013/0045361 A1 | 2/2013 | Willson |

FOREIGN PATENT DOCUMENTS

| JP | 06-202329 | 7/1994 |
| JP | 2002-519728 | 7/2002 |
| JP | 2003-218383 | 7/2003 |
| JP | 2005-007244 | 1/2005 |
| JP | 2005-008701 | 1/2005 |
| JP | 2007-246600 | 9/2007 |
| JP | 2008-149447 | 7/2008 |
| JP | 2009-175746 | 8/2009 |
| JP | 2010-058403 | 3/2010 |
| JP | 2010-202723 A | 9/2010 |
| TW | 200821641 A | 5/2008 |
| WO | WO 2007/132901 | 11/2007 |

OTHER PUBLICATIONS

International Search Report for corresponding International Application No. PCT/JP2012/078394, dated Feb. 5, 2013 (w/ English translation).

(Continued)

*Primary Examiner* — Jeffrey C Mullis

(74) *Attorney, Agent, or Firm* — Oblon, McClelland, Maier & Neustadt, L.L.P.

(57) ABSTRACT

A block copolymer includes a polystyrene block including a styrene unit, and a polyalkyl (meth)acrylate block including an alkyl (meth)acrylate unit. The block copolymer includes an organic group that is bound to at least one end of a main chain of the block copolymer and that comprises a hetero atom. A polymerization initiation end of the block copolymer includes a structure derived from an alkyl lithium. The organic group included in the block copolymer includes a nitrogen atom, a sulfur atom, a phosphorus atom, a tin atom, or a combination thereof, or is represented by formula (1). $R^1$ represents a single bond or a divalent organic group having 1 to 30 carbon atoms; and $R^2$ represents a hydrogen atom, an aliphatic linear hydrocarbon group having 1 to 30 carbon atoms, an alicyclic hydrocarbon group having 3 to 30 carbon atoms, or the like.

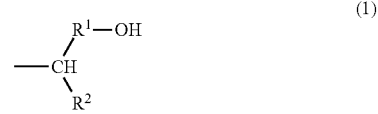

(1)

14 Claims, 5 Drawing Sheets

(56) References Cited

OTHER PUBLICATIONS

Guillaneuf et al., Macromolecules, 2010, (43), pp. 93-100, Oct. 2009.
Office Action dated Dec. 26, 2014, in Taiwan Patent Application No. 101141584 filed Nov. 8, 2012 (w/ English translation).
Extended European Search Report dated Jul. 1, 2015 in Patent Application No. 12848021.7.
Office Action dated Feb. 26, 2016, in Taiwan Patent Application No. 101141584 (w/ English translation).
Office Action dated Mar. 23, 2017, in Taiwan Patent Re-examination Application No. 101141584 (w/ English translation).

* cited by examiner

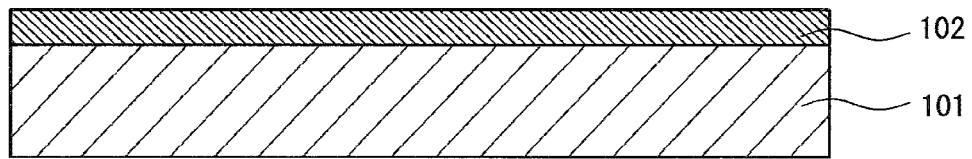
F I G. 1

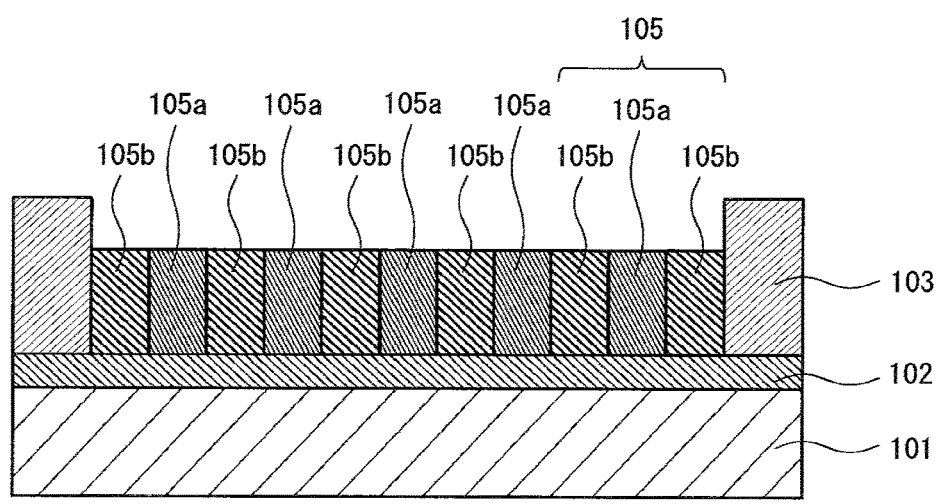
F I G. 4

BLOCK COPOLYMER

CROSS-REFERENCE TO RELATED APPLICATIONS

The present application is a continuation application of U.S. patent application Ser. No. 14/272,587 filed May 8, 2014, which is in turn a continuation application of International Application No. PCT/JP2012/078394, filed Nov. 1, 2012, which claims priority to Japanese Patent Application No. 2011-245991, filed Nov. 9, 2011, and to Japanese Patent Application No. 2012-180689, filed Aug. 16, 2012. The contents of these applications are incorporated herein by reference in their entirety.

BACKGROUND OF THE INVENTION

Field of the Invention

The present invention relates to a directed self-assembling composition for pattern formation, and a pattern-forming method.

Discussion of the Background

Miniaturization of various types of electronic device structures such as semiconductor devices and liquid crystal devices has been accompanied by demands for miniaturization of patterns in lithography processes. At present, although fine resist patterns having a line width of about 90 nm can be formed using, for example, an ArF excimer laser light, further finer pattern formation is required.

To meet the demands described above, some pattern-forming methods in which a phase separation structure by directed self-assembling, as generally referred to, is utilized that spontaneously forms an ordered pattern have been proposed. For example, an ultrafine pattern-forming method by directed self-assembling has been known in which a block copolymer is used which is obtained by copolymerizing a monomer compound having one property with a monomer compound having a property that is distinct from the one property (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). According to this method, annealing of a composition containing the block copolymer results in a tendency of clustering of polymer structures having the same property, and thus a pattern can be formed in a self-aligning manner. In addition, a method of forming a fine pattern by permitting directed self-assembling of a composition that contains a plurality of polymers having properties that are different from one another has been also known (see US Patent Application, Publication No. 2009/0214823, and Japanese Unexamined Patent Application, Publication No. 2010-58403).

SUMMARY OF THE INVENTION

According to one aspect of the present invention, a directed self-assembling composition for pattern formation includes a block copolymer. The block copolymer includes a polystyrene block having a styrene unit, and a polyalkyl (meth)acrylate block having an alkyl (meth)acrylate unit. The block copolymer has a group that is bound to at least one end of a main chain of the block copolymer and that includes a hetero atom.

According to another aspect of the present invention, a pattern-forming method includes providing a directed self-assembling film having a phase separation structure on a substrate using the directed self-assembling composition for pattern formation. A part of phases of the directed self-assembling film is removed.

According to further aspect of the present invention, a block copolymer includes a polystyrene block including a styrene unit, and a polyalkyl (meth)acrylate block including an alkyl (meth)acrylate unit. The block copolymer includes an organic group that is bound to at least one end of a main chain of the block copolymer and that comprises a hetero atom. A polymerization initiation end of the block copolymer includes a structure derived from an alkyl lithium. The organic group included in the block copolymer includes a nitrogen atom, a sulfur atom, a phosphorus atom, a tin atom, or a combination thereof, or is represented by formula (1).

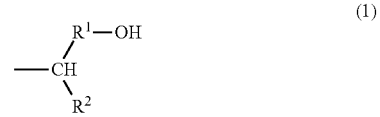

(1)

In the formula (1), $R^1$ represents a single bond or a divalent organic group having 1 to 30 carbon atoms; and $R^2$ represents a hydrogen atom, an aliphatic linear hydrocarbon group having 1 to 30 carbon atoms, an alicyclic hydrocarbon group having 3 to 30 carbon atoms, or a group in which the aliphatic linear hydrocarbon group having 1 to 30 carbon atoms or the alicyclic hydrocarbon group having 3 to 30 carbon atoms comprises a hetero atom between adjacent two carbon atoms. The organic group is not a monomeric unit included in the block copolymer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 1 shows a schematic view illustrating one example of a state after providing an underlayer film on a substrate in the pattern-forming method according to an embodiment of the present invention;

FIG. 4 shows a schematic view illustrating one example of a state after providing the directed self-assembling film on a region surrounded by the prepattern on the underlayer film in the pattern-forming method according to the embodiment of the present invention.

DESCRIPTION OF THE EMBODIMENTS

Figure 2:
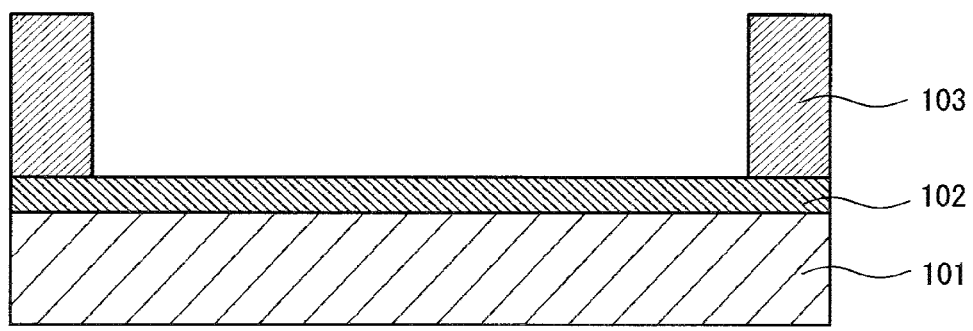
FIG. 2 shows a schematic view illustrating one example of a state after forming a prepattern on the underlayer film in the pattern-forming method according to the embodiment of the present invention.

According to a first embodiment of the invention made for solving the aforementioned problems, a directed self-assembling composition for pattern formation comprises:

(A) a block copolymer that includes a polystyrene block having a styrene unit, and a polyalkyl (meth)acrylate block having an alkyl (meth)acrylate unit (hereinafter, may be also referred to as " block copolymer (A)"), the block copolymer (A) having (α) a group that is bound to at least one end of a main chain and includes a hetero atom.

The directed self-assembling composition for pattern formation is likely to cause phase separation due to the group (α) that is bound to at least one end of a main chain and includes a hetero atom included in the block copolymer (A); therefore, a sufficiently fine pattern can be formed. In addition, due to having the group (α) that includes a hetero atom, the pattern configurations are stabilized, and a decrease of variation of pattern size is enabled. It is to be noted that an "end" as referred to in "at least one end of a main chain" means an endmost carbon atom of a polymer main chain moiety produced by synthesis of a polymer obtained by polymerizing the monomer.

The hetero atom is preferably an oxygen atom, a nitrogen atom, a sulfur atom, a phosphorus atom, a tin atom, a silicon atom or a combination thereof. When the block copolymer (A) has the group (α) that is bound to at least one end of a main chain and includes any one of these hetero atoms, phase separation is more likely to occur.

The group (α) is preferably represented by the following formula (1):

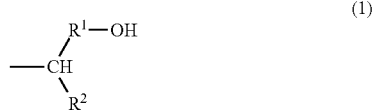
(1)

wherein, in the formula (1), $R^1$ represents a single bond or a divalent organic group having 1 to 30 carbon atoms; and $R^2$ represents a hydrogen atom or a monovalent organic group having 1 to 30 carbon atoms.

In the directed self-assembling composition for pattern formation, due to the block copolymer (A) having the group (α) that is bound to at least one end of a main chain and is represented by the above formula, phase separation is more likely to occur; therefore, a sufficiently fine and favorable pattern can be formed.

The alkyl (meth)acrylate unit is preferably a methyl methacrylate unit. The directed self-assembling composition for pattern formation is more likely to cause phase separation due to the alkyl (meth)acrylate unit being a methyl methacrylate unit, whereby a sufficiently fine and favorable pattern can be formed.

The block copolymer (A) is preferably a diblock copolymer or a triblock copolymer having a polystyrene block and a polyalkyl (meth)acrylate block. When the block copolymer (A) is the diblock copolymer or triblock copolymer, the directed self-assembling composition for pattern formation is still more likely to cause phase separation; therefore, a fine and favorable pattern can be formed.

A molar ratio of styrene units to alkyl (meth)acrylate units in the block copolymer (A) preferably falls within a range of no less than 10/90 and no greater than 90/10. According to the directed self-assembling composition for pattern formation, by selecting a ratio of the percentage content (mol %) of each of the units in the block copolymer (A) to fall within the above specific range, a fine and complicated pattern desired can be favorably formed.

The group (α) is preferably derived from an epoxy compound. For example, by using the epoxy compound, the group (α) that is a group derived from an epoxy compound can be readily introduced to a polymerization end of the block copolymer. In addition, when the group (α) is a group derived from an epoxy compound, the directed self-assembling composition for pattern formation is more likely to cause phase separation, whereby a fine and favorable pattern can be formed.

According to another embodiment of the present invention, a pattern-forming method includes the steps of:

(1) providing a directed self-assembling film having a phase separation structure on a substrate using the directed self-assembling composition for pattern formation of the first embodiment of the present invention; and (2) removing a part of phases of the directed self-assembling film.

In the pattern-forming method according to the another embodiment of the present invention, a directed self-assembling film is provided using the directed self-assembling composition for pattern formation; therefore, a sufficiently fine pattern can be formed.

It is preferred that the pattern-forming method according to the another embodiment of the present invention further includes before the step (1):

(0-1) providing an underlayer film on the substrate; and (0-2) forming a prepattern on the underlayer film, and in the step (1), the directed self-assembling film is provided in a region compartmentalized by the prepattern on the underlayer film, and that the method further includes after the step (1), (2') removing the prepattern.

When the pattern-forming method according to the another embodiment of the present invention further includes the steps of providing an underlayer film and forming a prepattern, phase separation of the directed self-assembling composition for pattern formation can be more precisely controlled, whereby the resultant pattern can be finer. It is to be noted that the prepattern as referred to means so-called guide pattern, which is a pattern for controlling both position and orientation of the phase separation of the block copolymer.

The pattern obtained by the pattern-forming method according to the another embodiment of the present invention is preferably a line-and-space pattern or a hole pattern. According to the pattern-forming method, a finer line-and-space pattern or a hole pattern desired can be formed.

According to embodiments of the present invention, a directed self-assembling composition for pattern formation that enables a sufficiently fine pattern to be formed, and a pattern-forming method in which the composition is used are provided. The directed self-assembling composition for pattern formation and the pattern-forming method of the embodiments of the present invention can be suitably used for lithography processes in manufacture of various types of electronic devices such as semiconductor devices and liquid crystal devices for which further miniaturization is demanded.

The embodiments will now be described with reference to the accompanying drawings, wherein like reference numerals designate corresponding or identical elements throughout the various drawings.

Directed Self-Assembling Composition for Pattern Formation

Directed self-assembling as referred to means a phenomenon of spontaneously constructing a tissue or structure without resulting from only the control from an external factor. According to the embodiment of the present invention, a film having a phase separation structure by directed self-assembling (i.e., directed self-assembling film) is formed by coating a directed self-assembling composition for pattern formation on a substrate, and a part of phases in the directed self-assembling film are removed, thereby enabling a pattern to be formed.

The directed self-assembling composition for pattern formation according to the embodiment of the present invention contains (A) a block copolymer that includes a polystyrene block having a styrene unit, and a polyalkyl (meth) acrylate block having an alkyl (meth)acrylate unit, in which the block copolymer (A) has a group (α) that is bound to at least one end of a main chain and includes a hetero atom. It is to be noted that the expression of "(meth)acrylate" as used herein means both methacrylate and acrylate. Since the directed self-assembling composition for pattern formation contains the block copolymer (A) having the group (α) that includes a hetero atom on at at least one end of a main chain of the polymer, phase separation is likely to occur, whereby a pattern having a sufficiently fine microdomain structure can be formed. The directed self-assembling composition for pattern formation may contain optional components such as a solvent and a surfactant in addition to the block copolymer (A), within a range not leading to impairment of the effects of the present invention. Hereinafter, each component will be explained in detail.

Block Copolymer (A)

The block copolymer (A) includes a polystyrene block having a styrene unit, and a polyalkyl (meth)acrylate block having an alkyl (meth)acrylate unit. The block copolymer (A) has the group (α) that is bound to at least one end of a main chain of the block copolymer (A) and has a hetero atom.

The block copolymer (A) has a structure in which a plurality of blocks at least including a polystyrene block and a polyalkyl (meth)acrylate block are linked. Each of the blocks has a chain structure of units derived from one type of monomer. In other words, the polystyrene block has a chain structure of styrene units, whereas the polyalkyl (meth)acrylate block has a chain structure of alkyl (meth) acrylate units. When the block copolymer (A) having such a plurality of blocks is dissolved in an appropriate solvent, the same type of blocks are aggregated to one another, and thus phases configured with the same type of the block are formed. In this step, it is presumed that a phase separation structure having an ordered pattern in which different types of phases are periodically and alternately repeated can be formed since the phases formed with different types of the blocks are not admixed with each other.

The block copolymer (A) may be composed only of the polystyrene block and the polyalkyl (meth)acrylate block, or may further include in addition to the polystyrene block and the polyalkyl (meth)acrylate block, any block other than these. However, in light of possible formation of a pattern having a finer microdomain structure, a block copolymer composed only of the polystyrene block and the polyalkyl (meth)acrylate block is preferred.

The block copolymer (A) composed only of the polystyrene block and the polyalkyl (meth)acrylate block is exemplified by diblock copolymers, triblock copolymers, tetrablock copolymers, and the like. Of these, in light of a capability of easy formation of a pattern having a fine microdomain structure desired, diblock copolymers and triblock copolymers are preferred, and diblock copolymers are more preferred.

The diblock copolymer is exemplified by a copolymer having a structure of a polystyrene block-polyalkyl (meth) acrylate block, and in particular, diblock copolymers having a structure in which the group (α) is bound to an end of a main chain of the polyalkyl (meth)acrylate block are preferred.

The triblock copolymer is exemplified by a copolymer having a structure of a polystyrene block-polyalkyl (meth) acrylate block-polystyrene block, or a polyalkyl (meth) acrylate block-polystyrene block-polyalkyl (meth)acrylate block.

The tetrablock copolymer is exemplified by a copolymer having a structure of a polystyrene block-polyalkyl (meth) acrylate block-polystyrene block-polyalkyl (meth)acrylate block.

Of these, in light of a capability of easy formation of a pattern having a fine microdomain structure desired, diblock copolymers and triblock copolymers are preferred, and diblock copolymers are more preferred. Diblock copolymers having a structure of a polystyrene block-polyalkyl (meth) acrylate block, and also having a structure in which the group (α) is bound to an end of a main chain of a polyalkyl (meth)acrylate block are still more preferred.

The polystyrene block has a styrene unit, and can be synthesized by polymerizing styrene. Further, the polyalkyl (meth)acrylate block has an alkyl (meth)acrylate unit, and can be synthesized by polymerizing alkyl (meth)acrylate.

As styrene described above, a styrene compound produced by substituting a part or all of hydrogen atoms included in styrene with a substituent may be also used.

As alkyl (meth)acrylate described above, alkyl (meth) acrylate having an alkyl group having 1 to 4 carbon atoms is preferred, which is exemplified by methyl methacrylate, ethyl methacrylate, propyl methacrylate, butyl methacrylate, methyl acrylate, ethyl acrylate, propyl acrylate, butyl acrylate, and the like. It is to be noted that a part or all of hydrogen atoms included in alkyl (meth)acrylate described above may be substituted with a substituent. Of these, alkyl (meth)acrylate is preferably methyl methacrylate.

Examples of the other block include (meth)acrylic blocks other than the polyalkyl (meth)acrylate blocks, and polyvinyl acetal blocks, polyurethane blocks, polyurea blocks, polyimide blocks, polyamide blocks, epoxy blocks, novolak phenol blocks, polyester blocks, and the like. The percentage content of the other block in the block copolymer (A) is preferably no greater than 10 mol % with respect to all structural units in the copolymer.

The molar ratio of the styrene unit to the polyalkyl (meth)acrylate unit in the block copolymer (A) is preferably no less than 10/90 and no greater than 90/10, more preferably no less than 20/80 and no greater than 80/20, and still more preferably no less than 30/70 and no greater than 70/30. When the ratio of the percentage content of (mol %) of the styrene unit to the percentage content of (mol %) of the polyalkyl (meth)acrylate unit in the block copolymer (A) falls within the above specific range, the directed self-assembling composition for pattern formation enables a pattern having a finer and favorable microdomain structure to be formed.

The block copolymer (A) can be synthesized by preparing the polystyrene block and the polyalkyl (meth)acrylate block, and further as needed, other block in a desired order, followed by subjecting its polymerization end to a treatment with an appropriate end treatment agent so as to introduce the group (α). Due to the structure of the block copolymer (A) having the group (α) on at least one end of a main chain, phase separation is more likely to occur, whereby the directed self-assembling composition for pattern formation enables a pattern having a still finer and favorable microdomain structure to be formed, as compared with conventional compositions.

Although the hetero atom in the group (α) that includes a hetero atom is not particularly limited, an oxygen atom, a nitrogen atom, a sulfur atom, a phosphorus atom, a tin atom, a silicon atom or a combination thereof is preferred, and an oxygen atom, a nitrogen atom and a sulfur atom are more preferred. An oxygen atom is still more preferred as the hetero atom.

The group (α) is preferably a group represented by the above formula (1).

In the above formula (1), $R^1$ represents a single bond or a divalent organic group having 1 to 30 carbon atoms; and $R^2$ represents a hydrogen atom or a monovalent organic group having 1 to 30 carbon atoms.

The divalent organic group having 1 to 30 carbon atoms represented by $R^1$ is exemplified by an aliphatic linear hydrocarbon group having 1 to 30 carbon atoms, an alicyclic hydrocarbon group having 3 to 30 carbon atoms, an aromatic hydrocarbon group having 6 to 30 carbon atoms, a group including any of the aliphatic linear hydrocarbon group having 1 to 30 carbon atoms, the alicyclic hydrocarbon group having 3 to 30 carbon atoms and the aromatic hydrocarbon group having 6 to 30 carbon atoms, further having a hetero atom such as an oxygen atom or a nitrogen atom between adjacent two carbon atoms, and the like.

Examples of the aliphatic linear hydrocarbon group having 1 to 30 carbon atoms include a methylene group, an ethanediyl group, a n-propanediyl group, an i-propanediyl group, a n-butanediyl group, an i-butanediyl group, a n-pentanediyl group, an i-pentanediyl group, a n-hexanediyl group, an i-hexanediyl group, and the like. Of these, in light of easier occurrence of phase separation of the directed self-assembling composition for pattern formation, a methylene group or an ethanediyl group is preferred, and a methylene group is more preferred.

Examples of the alicyclic hydrocarbon group having 3 to 30 carbon atoms include a cyclopropanediyl group, a cyclobutanediyl group, a cyclopentanediyl group, a cyclohexanediyl group, a cyclooctanediyl group, a norbornanediyl group, an adamantanediyl group, and the like.

Examples of the aromatic hydrocarbon group having 6 to 30 carbon atoms include a phenylene group, a naphthalenylene group, an anthracenylene group, and the like.

In addition, examples of the group including any of the aliphatic linear hydrocarbon group having 1 to 30 carbon atoms, the alicyclic hydrocarbon group having 3 to 30 carbon atoms and the aromatic hydrocarbon group having 6 to 30 carbon atoms, further having a hetero atom such as an oxygen atom or a nitrogen atom between adjacent two carbon atoms include groups that include a binding group having at least one hetero atom such as —O—, —CO—, —COO—, —OCO— or —NH— between adjacent two carbon atoms of the above hydrocarbon groups, and the like.

$R^1$ in the above formula preferably represents a single bond or an aliphatic linear hydrocarbon group having 1 to 30 carbon atoms, more preferably a methylene group or an ethanediyl group, and still more preferably a methylene group.

The monovalent organic group having 1 to 30 carbon atoms represented by $R^2$ is exemplified by an aliphatic linear hydrocarbon group having 1 to 30 carbon atoms, an alicyclic hydrocarbon group having 3 to 30 carbon atoms, an aromatic hydrocarbon group having 6 to 30 carbon atoms, a group including any of these hydrocarbon groups further having a hetero atom such as an oxygen atom or a nitrogen atom between adjacent two carbon atoms, and the like.

Examples of the aliphatic linear hydrocarbon group having 1 to 30 carbon atoms include a methyl group, an ethyl group, a n-propyl group, an i-propyl group, a n-butyl group, an i-butyl group, a n-pentyl group, an i-pentyl group, a n-hexyl group, an i-hexyl group, and the like.

Examples of the alicyclic hydrocarbon group having 3 to 30 carbon atoms include a cyclopropyl group, a cyclobutyl group, a cyclopentyl group, a cyclohexyl group, a cyclooctyl group, a norbornyl group, an adamantyl group, and the like.

Examples of the aromatic hydrocarbon group having 6 to 30 carbon atoms include a phenyl group, a naphthalenyl group, an anthracenyl group, and the like.

In addition, examples of the group including any of the aliphatic linear hydrocarbon group having 1 to 30 carbon atoms, the alicyclic hydrocarbon group having 3 to 30 carbon atoms and the aromatic hydrocarbon group having 6 to 30 carbon atoms, further having a hetero atom such as an oxygen atom or a nitrogen atom between adjacent two carbon atoms include groups that include a binding group having at least one hetero atom such as —O—, —CO—, —COO—, —OCO— or —NH— between adjacent two carbon atoms of the above hydrocarbon groups, a and the like.

$R^2$ in the above formula is preferably a hydrogen atom, an aliphatic linear hydrocarbon group having 1 to 30 carbon atoms, and an aliphatic linear hydrocarbon group having 1 to 30 carbon atoms having —O— between adjacent two carbon atoms, and more preferably a hydrogen atom, an aliphatic linear hydrocarbon group having 1 to 3 carbon atoms, and an aliphatic linear hydrocarbon group having 1 to 10 carbon atoms having —O— between adjacent two carbon atoms.

Examples of the group (α) include structures represented by the following formulae, and the like.

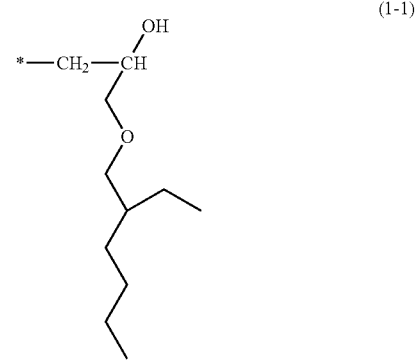

(1-1)

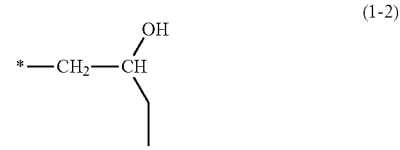

(1-2)

-continued
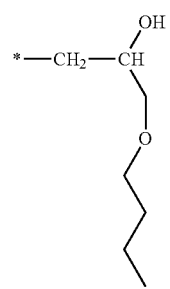 (1-3)
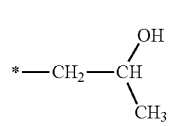 (1-4)
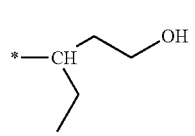 (1-5)
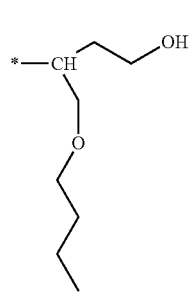 (1-6)
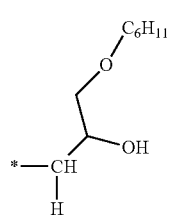 (1-7)
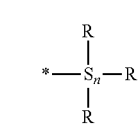 (1-8)
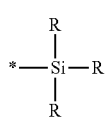 (1-9)
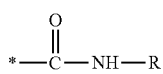 (1-10)
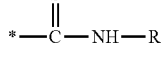 (1-11)
-continued
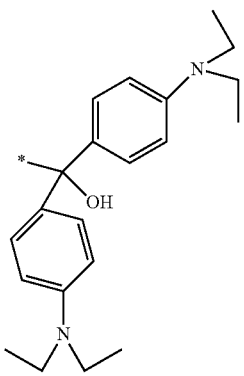 (1-12)
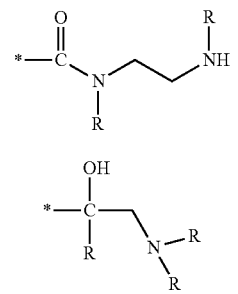 (1-13)
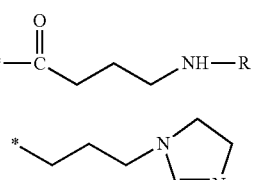 (1-14)
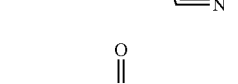 (1-15)
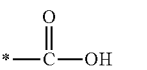 (1-16)
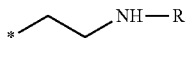 (1-17)
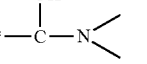 (1-18)
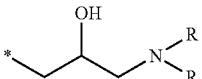 (1-19)
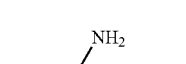 (1-20)
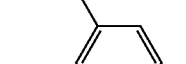 (1-21)
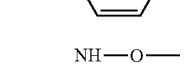 (1-22)
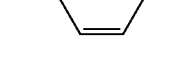 (1-23)

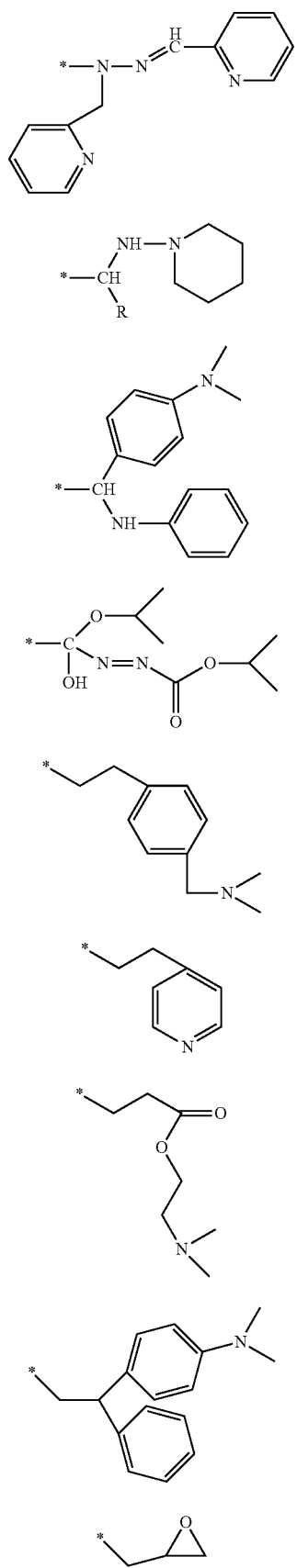
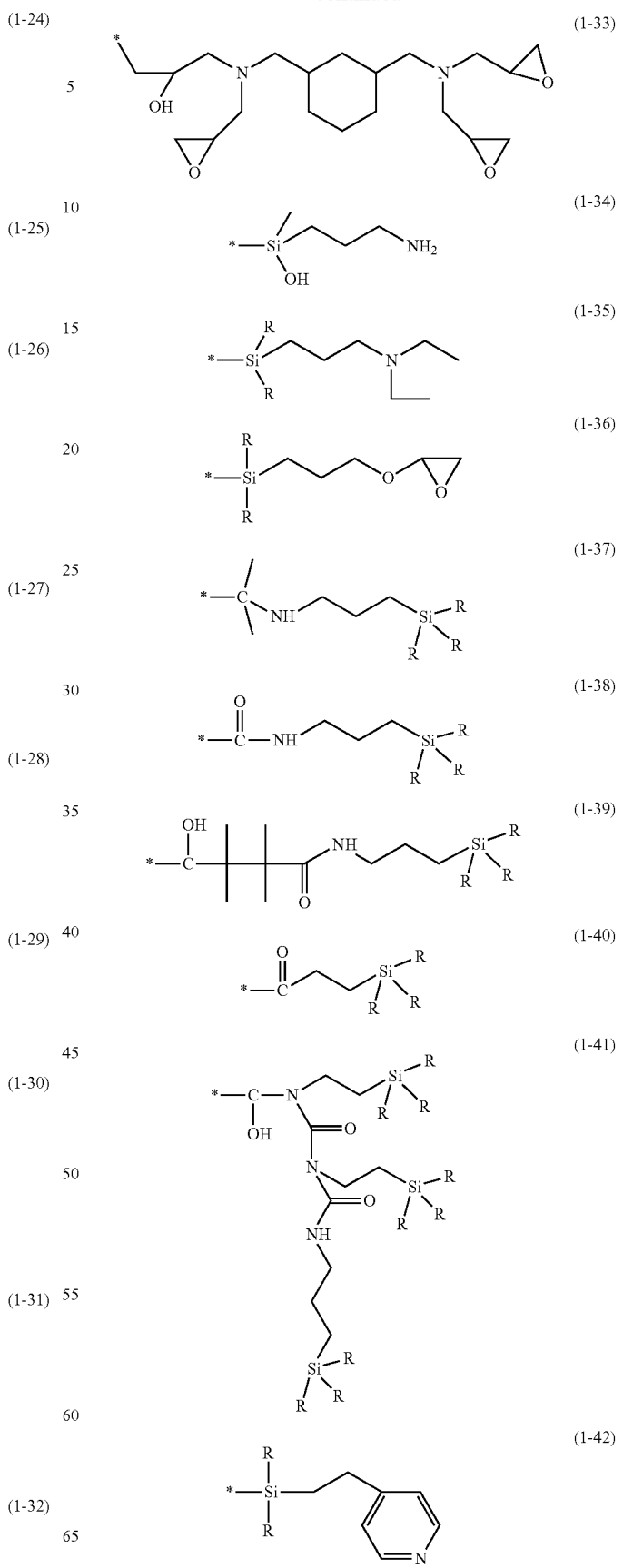

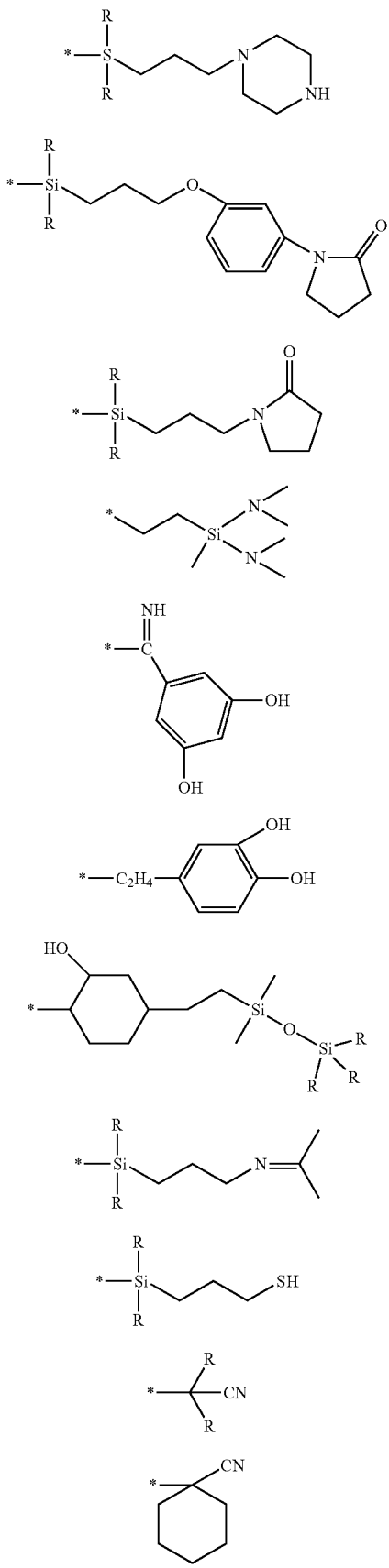

(1-43)
(1-44)
(1-45)
(1-46)
(1-47)
(1-48)
(1-49)
(1-50)
(1-51)
(1-52)
(1-53)
(1-54)
(1-55)
(1-56)
(1-57)
(1-58)

In the above formula, R represents a hydrogen atom or a monovalent organic group; * denotes a site that binds to a carbon atom of the main chain end of the polymer in the block copolymer (A).

Of these, as the group represented by the above formula (1), groups represented by the formulae (1-1) to (1-7) are preferred, and groups represented by the formulae (1-2), (1-3) and (1-4) are more preferred.

The block to which the group (α) of the block copolymer (A) binds may be the polystyrene block or the polyalkyl (meth)acrylate block, or the other block, but the polystyrene block or the polyalkyl (meth)acrylate block is preferred, and the polyalkyl (meth)acrylate block is more preferred. Due to having the structure in which the group (α) is bound to the end of the main chain of these blocks, the directed self-assembling composition for pattern formation enables a pattern having a finer and favorable microdomain structure to be formed.

Synthesis Method of Block Copolymer (A)

The block copolymer (A) may be synthesized by living anionic polymerization, living radical polymerization or the like, and of these, living anionic polymerization that enables an arbitrary end structure to be readily introduced is more preferred. For example, the block copolymer (A) may be synthesized by linking the polystyrene block, a polymethyl methacrylate block and a block other than these blocks are linked in a desired order while permitting polymerization, treating thus resultant polymerization end with an arbitrary end treatment agent, and introducing the group (α) such as a group represented by the above formula (1).

For example, when the block copolymer (A) that is a diblock copolymer constituted with the polystyrene block and the polymethyl methacrylate block is to be synthesized, the polystyrene block is first synthesized by polymerizing styrene using an anion polymerization initiator in an appropriate solvent. Next, methyl methacrylate is similarly polymerized to synthesize the polymethyl methacrylate block so as to link to the polystyrene block.

Thereafter, the group (α) can be introduced to ends of main chains of the polymethyl methacrylate block by carrying out a treatment with an end treatment agent such as 1,2-butylene oxide. It is to be noted that for synthesizing each block, for example, a method in which a solution containing a monomer is added to a reaction solvent containing an initiator dropwise to allow for a polymerization reaction, or the like may be employed.

Examples of the solvent for use in the polymerization include:

alkanes such as n-pentane, n-hexane, n-heptane, n-octane, n-nonane and n-decane;

cycloalkanes such as cyclohexane, cycloheptane, cyclooctane, to decalin and norbornane;

aromatic hydrocarbons such as benzene, toluene, xylene, ethylbenzene and cumene;

halogenated hydrocarbons such as chlorobutanes, bromohexanes, dichloroethanes, hexamethylenedibromide and chlorobenzene;

saturated carboxylate esters such as ethyl acetate, n-butyl acetate, i-butyl acetate and methyl propionate;

ketones such as acetone, 2-butanone, 4-methyl-2-pentanone and 2-heptanone;

ethers such as tetrahydrofuran, diethoxyethanes and diethoxyethanes;

alcohols such as methanol, ethanol, 1-propanol, 2-propanol and 4-methyl-2-pentanol, and the like.

These solvents may be used either alone, or two or more types thereof may be used in combination.

The reaction temperature in the polymerization may be appropriately predetermined in accordance with the type of the initiator, and the reaction temperature is typically −150° C. to 50° C., and preferably −80° C. to 40° C. The reaction time period is typically 5 min to 24 hrs, and preferably 20 min to 12 hrs.

Examples of the initiator for use in the polymerization include alkyl lithium, alkyl magnesium halide, naphthalene sodium, alkylated lanthanoid compounds, and the like. Of these, when the polymerization is carried out using styrene and methyl methacrylate as monomers, an alkyl lithium compound is preferably used.

An exemplary procedure for the end treatment may be to execute a reaction as shown in the following scheme, and the like. More specifically, the end treatment agent such as 1,2-butylene oxide is added to a resultant block copolymer to modify the end, and then a demetallation treatment with an acid or the like is carried out, whereby a block copolymer having, for example the group (α) represented by the above formula (1) at the end can be obtained.

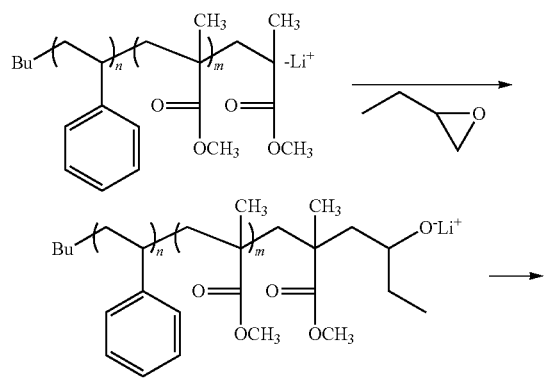

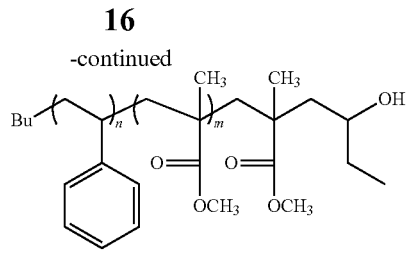

In the above scheme, n and m are each an integer of 10 to 5,000.

Examples of the end treatment agent include:

epoxy compounds such as 1,2-butylene oxide, butyl glycidyl ether, 2-ethylhexyl glycidyl ether, propylene oxide, ethylene oxide and epoxyamine;

nitrogen-containing compounds such as isocyanate compounds, thioisocyanate compounds, imidazolidinone, imidazole, aminoketone, pyrrolidone, diethylaminobenzophenone, nitrile compounds, aziridine, formamide, epoxyamine, benzylamine, oxime compounds, azine, hydrazone, imine, azocarboxylate esters, aminostyrene, vinylpyridine, aminoacrylate, aminodiphenyl ethylene and imide compounds;

silane compounds such as alkoxysilane, aminosilane, ketoiminosilane, isocyanatosilane, siloxane, glycidylsilane, mercaptosilane, vinylsilane, epoxysilane, pyridylsilane, piperazylsilane, pyrrolidonesilane, cyanosilane and silane isocyanate;

tin halides, silicon halides, carbon dioxides, and the like. Of these, epoxy compounds are preferred, and 1,2-butylene oxide, butyl glycidyl ether, 2-ethylhexyl glycidyl ether and propylene oxide are more preferred.

The block copolymer (A) subjected to the end treatment is preferably recovered by a reprecipitation technique. More specifically, after completing the end treatment reaction, the reaction liquid is charged into a reprecipitation solvent to recover the intended copolymer in the form of powder. As the reprecipitation solvent, an alcohol, an alkane and the like may be used either alone or as a mixture of two or more thereof. As an alternative to the reprecipitation technique, a liquid separating operation, column operation, ultrafiltration operation or the like may be employed to recover the polymer through eliminating low molecular components such as monomers and oligomers.

The weight average molecular weight (Mw) as determined by gel permeation chromatography (GPC) of the block copolymer (A) is preferably 1,000 to 150,000, more preferably 1,500 to 120,000, and still more preferably 2,000 to 100,000. When the block copolymer (A) has Mw falling within the above specific range, the directed self-assembling composition for pattern formation enables a pattern having a finer and favorable microdomain structure to be formed.

The ratio (Mw/Mn) of Mw to the number average molecular weight (Mn) of the block copolymer (A) is typically 1 to 5, preferably 1 to 3, more preferably 1 to 2, still more preferably 1 to 1.5, and particularly preferably 1 to 1.2. When the ratio Mw/Mn falls within such a specific range, the directed self-assembling composition for pattern formation enables a pattern having a still finer and favorable microdomain structure to be formed.

Mw and Mn are determined by gel permeation chromatography (GPC) using: GPC columns (G2000HXL×2, G3000HXL×1, G4000HXL×1, all manufactured by Tosoh Corporation); a differential refractometer as a detector; and mono-dispersed polystyrene as a standard, under analytical conditions involving a flow rate of 1.0 mL/min, with an elution solvent of tetrahydrofuran, the sample concentration of 1.0% by mass, and the amount of an injected sample of 100 μL, at a column temperature of 40° C.

Solvent

The directed self-assembling composition for pattern formation usually contains a solvent. Examples of the solvent include those similar to the solvents exemplified in connection with, to for example, the solvent for use in the synthesis method of the block copolymer (A). Of these, propylene glycol monomethyl ether acetate is preferred. It is to be noted that these solvents may be used either alone, or two or more types thereof may be used in combination.

Surfactant

The directed self-assembling composition for pattern formation may further contain a surfactant. Due to containing the surfactant, the directed self-assembling composition for pattern formation enables coating properties onto the substrate and the like to be improved.

Preparation Method of Directed Self-Assembling Composition for Pattern Formation The directed self-assembling composition for pattern formation may be prepared by, for example, mixing the block copolymer (A), the surfactant and the like in the solvent at a predetermined ratio. Furthermore, the directed self-assembling composition for pattern formation may be prepared and used in a state being dissolved or dispersed in an appropriate solvent.

Pattern-Forming Method

The pattern-forming method according to an embodiment of the present invention includes the steps of:

(1) providing a directed self-assembling film having a phase separation structure on a substrate using the directed self-assembling composition for pattern formation of the embodiment of the present invention and (2) removing a part of phases of the directed self-assembling film.

It is preferred that the pattern-forming method according to the another embodiment of the present invention further includes before the step (1): (0-1) providing an underlayer film on a substrate; and (0-2) forming a prepattern on the underlayer film, and in the step (1), the directed self-assembling film is provided in a region compartmentalized by the prepattern on the underlayer film, and that the method further includes after the step (1), (2') removing the prepattern.

In addition, it is preferred that the method further includes after the step (2), the step of (3) etching the substrate using the formed pattern as a mask. Each step will be described in detail below. Note that each step will be explained with reference to FIGS. 1 to 5.

Step (0-1)

According to this step, a composition for forming an underlayer film is used to provide an underlayer film on the substrate. Thus, as shown in FIG. 1, a substrate having an underlayer film can be obtained which includes the underlayer film 102 provided on the substrate 101, and the directed self-assembling film is provided on the underlayer film 102. The phase separation structure (microdomain structure) included in the directed self-assembling film is altered by not only an interaction between each block of the block copolymer (A) contained in the directed self-assembling composition for pattern formation but also an interaction with the underlayer film 102; therefore, the structure can be easily controlled by virtue of having the underlayer film 102, and thus a desired pattern can be obtained. Moreover, when the directed self-assembling film is thin, a transfer process thereof can be improved owing to having the underlayer film 102.

As the substrate 101, for example, a conventionally well-known substrate such as a silicon wafer, a wafer coated with aluminum or the like may be used.

Also, as the composition for forming an underlayer film, a conventionally well-known organic material for forming an underlayer film may be used.

Although the procedure for providing the underlayer film 102 is not particularly limited, the underlayer film 102 may be provided by, for example, coating by a well-known method such as a spin coating method on the substrate 101 to give a coating film, followed by exposure and/or heating to permit curing. Examples of the radioactive ray which may be employed for the exposure include visible light rays, ultraviolet rays, far ultraviolet rays, X-rays, electron beams, γ-rays, molecular beams, ion beams, and the like. Moreover, the temperature employed during heating the coating film is not particularly limited, and the temperature is preferably 90 to 550° C., more preferably 90 to 450° C., and still more preferably 90 to 300° C. Furthermore, the film thickness of the underlayer film 102 is not particularly limited, and the film thickness is preferably 50 to 20,000 nm, and more preferably 70 to 1,000 nm. Still further, the underlayer film 102 preferably includes an SOC (Spin on carbon) film.

Step (0-2)

According to this step, as shown in FIG. 2, a prepattern 103 is formed on the underlayer film 102 using a composition for prepattern formation. The prepattern 103 allows a pattern configuration obtained by phase separation of the directed self-assembling composition for pattern formation to be controlled, and thus a desired fine pattern can be formed. More specifically, among the blocks included in the block copolymer (A) contained in the directed self-assembling composition for pattern formation, blocks having a higher affinity to lateral faces of the prepattern form the phases along the prepattern, whereas blocks having a lower affinity form the phases at positions away from the prepattern. Accordingly, a desired pattern can be formed. In addition, according to the material, size, shape, etc., of the prepattern, the structure of the pattern obtained by obtained by phase separation of the directed self-assembling composition for pattern formation can be finely controlled. It is to be noted that the prepattern may be appropriately selected depending on the pattern intended to be finally formed, for example, a line-and-space pattern, a hole pattern and the like may be employed.

As the method for forming the prepattern 103, those similar to well-known resist pattern-forming methods may be used. In addition, a conventional composition for forming a resist film may be used as the composition for prepattern formation. In a specific method for forming the prepattern 103, for example, a commercially available chemical amplification resist composition is used to provide a resist film on the underlayer film 102 by coating. Next, an exposure is carried out by irradiating a desired region of the resist film with a radioactive ray through a mask of a specific pattern. Examples of the radioactive ray include ultraviolet rays, far ultraviolet rays, X-rays, charged particle rays, and the like. Of these, far ultraviolet rays typified by ArF excimer laser beams and KrF excimer laser beams are preferred, and ArF excimer laser beams are more preferred. Also, the exposure may employ a liquid immersion medium for liquid immersion lithography. Subsequently, post exposure baking (PEB) is carried out, followed by development using a developer solution such as an alkaline developer solution or an organic solvent, whereby a desired prepattern 103 can be formed.

It is to be noted that the surface of the prepattern 03 may be subjected to a hydrophobilization treatment or a hydrophilization treatment. In specific treatment methods, a hydrogenation treatment including exposing to hydrogen plasma for a certain time period, and the like may be adopted. An increase of the hydrophobicity or hydrophilicity of the surface of the prepattern 103 enables directed self-assembling of the directed self-assembling composition for pattern formation to be accelerated.

Step (1)

Figure 3:
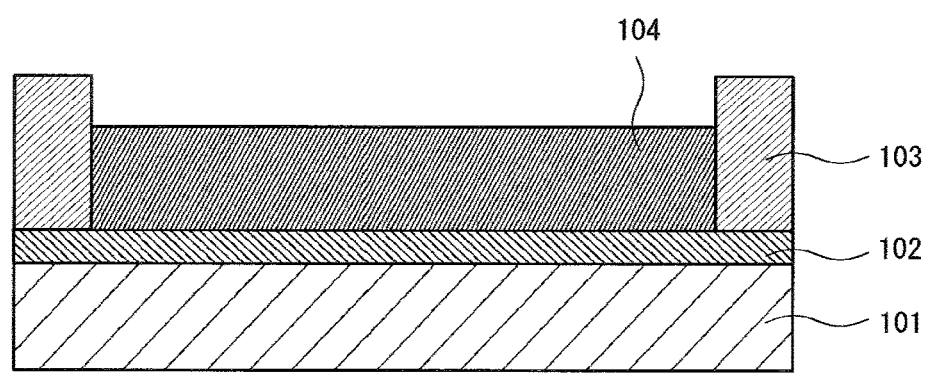
FIG. 3 shows a schematic view illustrating one example of a state after coating a directed self-assembling composition for pattern formation on a region surrounded by the prepattern on the underlayer film in the pattern-forming method according to the embodiment of the present invention.

In this step, a directed self-assembling film having a phase separation structure is provided on the substrate using the directed self-assembling composition for pattern formation. In the case in which the underlayer film and the prepattern are not used, the directed self-assembling composition for pattern formation is directly coated on the substrate to give a coating film, whereby the directed self-assembling film having a phase separation structure is provided. Moreover, in a case in which the underlayer film and the prepattern are used, as shown in FIGS. 3 and 4, the directed self-assembling composition for pattern formation is coated on the region surrounded by the prepattern 103 on the underlayer film 102 to give the coating film 104, whereby a directed self-assembling film 105 having a phase separation structure having an interface that is substantially perpendicular to the substrate 101 is provided on the underlayer film 102 formed on the substrate 101 according to the step (1). More specifically, coating on the substrate the directed self-assembling composition for pattern formation containing the block copolymer (A) having two or more types of blocks that are not compatible with each other, followed by annealing and the like allows blocks having identical properties to be assembled with one another to spontaneously form an ordered pattern, as generally referred to, and thus enables directed self-assembling to be accelerated. Accordingly, a directed self-assembling film having a phase separation structure such as a sea-island structure, a cylinder structure, a co-interconnected structure or a lamellar structure can be formed, and these phase separation structures preferably have an interface substantially perpendicular to the substrate 101. In this step, by using the directed self-assembling composition for pattern formation, occurrence of phase separation is facilitated, and therefore, formation of a finer phase separation structure (microdomain structure) is enabled.

When the prepattern is involved, the phase separation structure is preferably formed along the prepattern, and the interface formed by the phase separation is preferably substantially parallel to the lateral face of the prepattern. For example, in a case in which an affinity of the styrene block of the block copolymer (A) to the prepattern 103 is high, the phases (105b) of the styrene blocks are linearly formed along the prepattern 103, and adjacent thereto, phases (105a) of the polymethyl methacrylate blocks and phases (105b) of the styrene block are alternately arranged in this order to form a lamellar phase separation structure or the like. It is to be noted that the phase separation structure formed in this step is configured with a plurality of phases, and the interface formed by these phases is substantially perpendicular, in general; however, the interface per se may not necessarily be clear. In addition, a desired fine pattern can be obtained by strictly controlling the resultant phase separation structure depending on a ratio of the length of each block chain (styrene block chain, polymethyl methacrylate block chain, etc.) in molecules of the block copolymer (A), the length of the molecule of the block copolymer (A), the prepattern, the underlayer film, and the like.

Although the procedure for providing the coating film 104 by coating the directed self-assembling composition for pattern formation on the substrate is not particularly limited, for example, a procedure in which the directed self-assembling composition for pattern formation employed is coated by spin coating or the like, and the like may be involved. Accordingly, the directed self-assembling composition for pattern formation is filled between the prepattern 103 on the underlayer film 102.

The annealing process may include, for example, heating at a temperature of 80° C. to 400° C. in an oven, on a hot plate, etc., and the like. The annealing time period is typically 1 min to 120 min, and preferably 5 min to 90 min. The film thickness of the directed self-assembled film 150 thus obtained is preferably 0.1 nm to 500 nm, and more preferably 0.5 nm to 100 nm.

Step (2)

Figure 5:
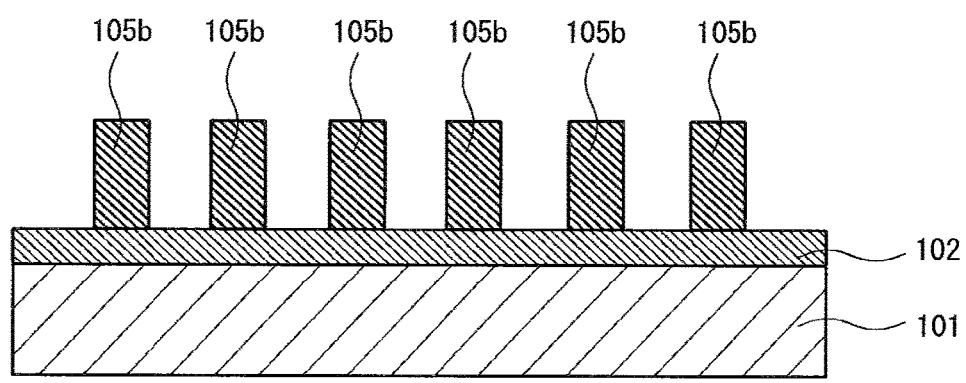
FIG. 5 shows a schematic view illustrating one example of a state after removing a part of phases of the directed self-assembling film and the prepattern in the pattern-forming method according to the embodiment of the present invention.

In this step, as shown in FIGS. 4 and 5, block phases 105a, a part of phases of the phase separation structure, included in the directed self-assembling film 105 are removed. The polymethyl methacrylate block phases 105a can be removed with an etching treatment by making use of the difference in the etching rate of each phase generated by phase separation by way of the directed self-assembling. A state after removing the polymethyl methacrylate block phases 105a of the phase separation structure, and the prepattern 103 as described later, is shown in FIG. 5. It is to be noted that prior to the etching treatment, irradiation with a radioactive ray may be conducted as needed. As the radioactive ray, in a case in which the phases to be removed by etching are polymethyl methacrylate block phases, a radioactive ray of 254 nm may be used. The irradiation with the radioactive ray results in decomposition of the polymethyl methacrylate block phases, to whereby etching can be facilitated.

As the procedure for removing the polymethyl methacrylate block phases 105a of the phase separation structure included in the directed self-assembling film 105, well-known procedures e.g., reactive ion etching (RIE) such as chemical dry etching and chemical wet etching; physical etching such as sputter etching and ion beam etching, and the like may be exemplified. Of these, reactive ion etching (RIE) is preferred, and in particular, chemical dry etching using $CF_4$, $O_2$ gas or the like, and chemical wet etching (wet development) using an etching solution, a liquid such as an organic solvent or hydrofluoric acid, are more preferred. Examples of the organic solvent include alkanes such as n-pentane, n-hexane and n-heptane, cycloalkanes such as cyclohexane, cycloheptane and cyclooctane, saturated carboxylate esters such as ethyl acetate, n-butyl acetate, i-butyl acetate and methyl propionate, ketones such as acetone, 2-butanone, 4-methyl-2-pentanone and 2-heptanone, alcohols such as methanol, ethanol, 1-propanol, 2-propanol and 4-methyl-2-pentanol, and the like. These solvents may be used either alone, or two or more types thereof may be used in combination.

Step (2')

In this step, the prepattern 103 is removed as shown in FIGS. 4 and 5. Removal of the prepattern 103 enables a finer and complicated pattern to be formed. It is to be noted that with respect to the procedure for removing the prepattern 103, description of the procedure for removing a part of the block phases 105a of the phase separation structure may be employed. Also, this step may be carried out concomitantly with the step (2), or may be carried out before or after the step (2).

Step (3)

In this step, after the step (2), using the pattern configured with the polystyrene block phases 105b that are a part of the block phases of the residual phase separation film as a mask, the underlayer film and the substrate are etched to permit patterning. After completion of the patterning onto the substrate, the phases used as a mask are removed from the substrate by a dissolving treatment or the like, whereby a patterned substrate (pattern) can be finally obtained. As the procedure for the etching, the procedure similar to those in the step (2) may be employed, and the etching gas and the etching solution may be appropriately selected according to the materials of the underlayer film and the substrate. For example, in a case in which the substrate is a silicon material, a gas mixture of chlorofluorocarbon-containing gas and $SF_4$, or the like may be used. Also, in a case in which the substrate is a metal film, a gas mixture of $BCl_3$ and $Cl_2$, or the like may be used. It is to be noted that the pattern obtained according to the pattern-forming method is suitably used for semiconductor elements and the like, and further the semiconductor elements are widely used for LED, solar cells and the like.

EXAMPLES

Hereinafter, the present invention will be explained more specifically by way of Examples, but the present invention is not limited to these Examples. Methods of the determination of various types of physical property values are shown below.
Weight Average Molecular Weight (Mw) and Number Average Molecular Weight (Mn)

The Mw and the Mn of the polymer were determined by gel permeation chromatography (GPC) using GPC columns (G2000 HXL×2, G3000 HXL×1, G4000 HXL×1) manufactured by Tosoh Corporation under the following conditions.
  eluent: tetrahydrofuran (manufactured by Wako Pure Chemical Industries, Ltd.)
  flow rate: 1.0 mL/min
  sample concentration: 1.0% by mass
  amount of injected sample: 100 μL
  detector: differential refractometer
  standard substance: mono-dispersed polystyrene
$^{13}$C-NMR Analysis:

The $^{13}$C-NMR analysis was carried out using JNM-EX400 manufactured by JEOL, Ltd., with DMSO-$d_6$ for use as a solvent for measurement. The percentage content of each structural unit in the polymer was calculated from each area ratio of the peak responding to each structural unit on the spectrum obtained by $^{13}$C-NMR.
Synthesis of Block Copolymer (A)

Synthesis Example 1

After a 500 mL flask, a reaction vessel, was dried under reduced pressure, 200 g of tetrahydrofuran which had been subjected to a distillation dehydrating treatment in a nitrogen atmosphere was charged, and cooled to −78° C. Thereafter, 0.27 g of a 1 N s-butyl lithium (s-BuLi) solution in cyclohexane was charged, and 10.7 g of styrene (0.103 mol) which had been subjected to a distillation dehydrating treatment was added dropwise thereto over 30 min. During this operation, the internal temperature of the reaction solution was carefully adjusted so as not to be −60° C. or higher. After completion of the dropwise addition, the mixture was aged for 30 min, and then 10.3 g of methyl methacrylate (0.103 mol) which had been subjected to a distillation dehydrating treatment was further added dropwise over 30 min, followed by allowing for the reaction for 30 min. Thereafter, 1 g of 1,2-butylene oxide as an end treatment agent was charged, and the reaction was permitted. The temperature of the reaction solution was elevated to a room temperature, and the obtained reaction solution was concentrated. Substitution with propylene glycol methyl ether acetate (PGMEA) was followed by charging 1,000 g of a 2% aqueous oxalic acid solution, and the mixture was stirred and left to stand. Then an aqueous layer as the underlayer was eliminated. This operation was repeated three times to eliminate the lithium salt, then 1,000 g of ultra pure water was charged, and the mixture was stirred, followed by elimination of the aqueous layer as the underlayer. After this operation was repeated three times to eliminate oxalic acid, the solution was concentrated and added into 500 g of n-hexane dropwise, thereby allowing the polymer to be precipitated. After a vacuum-filtrated resin was washed with n-hexane twice, drying under reduced pressure at 60° C. gave 20.5 g of a white block copolymer (A-1).

The block copolymer (A-1) had Mw of 41,200, and Mw/Mn was 1.13. In addition, as a result of a $^{13}$C-NMR analysis, a ratio of a percentage content of the styrene units to a percentage content of of methyl methacrylate units in the block copolymer (A-1) was 50.1 (mol %): 49.9 (mol %). It should be noted that the block copolymer (A-1) was a diblock copolymer configured with a polystyrene block and a polymethyl methacrylate block, and the end of the polymethyl methacrylate block was modified with the end treatment agent.

Synthesis Examples 2 to 8

Diblock copolymers (A-2) to (A-6) and (a-1) to (a-2) were synthesized in a similar manner to Synthesis Example 1 except that the amount of the 1 N s-BuLi solution in cyclohexane used, and the type of the end treatment agent were as shown in Table 1. The percentage content of the styrene unit, and the percentage content of the methyl methacrylate unit, Mw and Mw/Mn in the each block copolymer are shown in Table 1.

TABLE 1

| | (A) Component | Type | Amount of 1N s-BuLi solution in cyclohexane (g) | End treatment agent | Percentage content (mol %) | | Mw | Mw/Mn |
| | | | | | styrene unit | methyl methacrylate unit | | |
| --- | --- | --- | --- | --- | --- | --- | --- | --- |
| Synthesis Example 1 | A-1 | diblock form | 0.27 | 1,2-butylene oxide | 50.1 | 49.9 | 41,200 | 1.13 |
| Synthesis Example 2 | A-2 | diblock form | 0.23 | 1,2-butylene oxide | 50.3 | 49.7 | 55,000 | 1.09 |

TABLE 1-continued

| (A) Component | | Type | Amount of 1N s-BuLi solution in cyclohexane (g) | End treatment agent | Percentage content (mol %) | | Mw | Mw/Mn |
|---|---|---|---|---|---|---|---|---|
| | | | | | styrene unit | methyl methacrylate unit | | |
| Synthesis Example 3 | A-3 | diblock form | 0.15 | 1,2-butylene oxide | 49.8 | 50.2 | 81,200 | 1.15 |
| Synthesis Example 4 | A-4 | diblock form | 0.29 | butyl glycidyl ether | 50.5 | 49.5 | 45,800 | 1.14 |
| Synthesis Example 5 | A-5 | diblock form | 0.20 | propylene oxide | 50.3 | 49.7 | 71,300 | 1.08 |
| Synthesis Example 6 | A-6 | diblock form | 0.09 | 1,2-butylene oxide | 49.6 | 50.4 | 134,000 | 1.13 |
| Synthesis Example 7 | a-1 | diblock form | 0.18 | methanol | 50.0 | 50.0 | 79,000 | 1.14 |
| Synthesis Example 8 | a-2 | diblock form | 0.45 | methanol | 50.2 | 49.8 | 29,000 | 1.10 |

Preparation of Directed Self-Assembling Composition For Pattern Formation

Examples 1 to 5 and Comparative Examples 1 to 2

The diblock copolymers were each dissolved in propylene glycol methyl ether acetate (PGMEA) to prepare 1% by mass solutions. These solutions were filtered through a membrane filter having a pore size of 200 nm to prepare directed self-assembling compositions for pattern formation, and patterns were formed according to the following method.

Pattern-Forming Method 1

On a 12-inch silicon wafer was spin-coated a composition for forming an underlayer film containing a crosslinking agent using CLEAN TRACK ACT12 (manufactured by Tokyo Electron Limited), followed by baking at 205° C. for 60 sec to provide an underlayer film having a film thickness of 77 nm. Next, after an ArF resist composition containing an acid-labile resin, a photo acid generating agent and an organic solvent was spin-coated on the underlayer film, prebaking (PB) was carried out at 120° C. for 60 sec to provide a resist film having a film thickness of 60 nm. Then, the resist film was exposed through a mask pattern using ArF Immersion Scanner (NSR S610C, manufactured by Nikon Corporation), under an optical condition involving NA of 1.30, CrossPole, and σ of 0.977/0.78. Thereafter, PEB was carried out at 115° C. for 60 sec, and then a development with a 2.3 8% by mass aqueous tetramethylammonium hydroxide solution at 23° C. for 30 sec, followed by washing with water and drying gave a prepattern (1) with holes having a diameter of 75 nm/a pitch of 150 nm. Subsequently, the prepattern was irradiated with an ultraviolet ray of 254 nm under a condition of 150 mJ/cm², followed by baking at 170° C. for 5 min to obtain a substrate for evaluations.

Next, each directed self-assembling composition for pattern formation was coated on the substrate for evaluations so as to give a thickness of 30 nm, and heated at 250° C. for 5 min to cause phase separation, whereby a microdomain structure was formed. Furthermore, after irradiation with a radioactive ray of 254 nm at to 3,000 mJ/cm², immersion in a solution of methyl isobutyl ketone (MIBK)/2-propanol (IPA)=2/8 (mass ratio) for 5 min allowed methyl methacrylate phases to be removed, whereby a pattern (1) was formed.

Pattern-Forming Method 2

The pattern (2) was formed by an operation similar to the pattern-forming method 1 except that the shape of the mask pattern was changed to give the prepattern (2) having a line of 75 nm and a pitch of 150 nm.

Evaluations

The pattern (1) formed as described above was observed using a line-width measurement SEM (S-4800, manufactured by Hitachi, Ltd.), and the width of a groove portion that looked white was measured to determine a width (nm) of the microdomain structure.

The evaluation was made to be "favorable" when the width (nm) of the microdomain structure was no greater than 30 nm, whereas the evaluation was made to be "unfavorable" when the width (nm) of the microdomain structure was greater than 30 nm or when formation of the microdomain structure failed.

In addition, the pattern (2) formed as described above was observed from above the pattern using a scanning electron microscope (CG4000, manufactured by Hitachi High-Technologies Corporation), and the line widths of the pattern were measured at arbitrary 10 points. From the measurements of the line widths, 3 Sigma values were determined as a degree of distribution, and the 3 Sigma value was defined as LWR (nm). The evaluation was made to be favorable when LWR (nm) was no greater than 5 nm, whereas the evaluation was made to be unfavorable when LWR (nm) exceeded 5 nm or when formation of the microdomain structure failed.

The results of evaluations of the width of microdomain structure and LWR are shown in Table 2. It is to be noted that "-" in Table 2 denotes a failure of the measurement of the width of the microdomain structure and LWR since a microdomain structure was not formed.

TABLE 2

| | (A) Component | Solvent | Width of microdomain structure (nm) | LWR (nm) |
|---|---|---|---|---|
| Example 1 | A-1 | PGMEA | 14.0 | 4.2 |
| Example 2 | A-2 | PGMEA | 17.2 | 3.9 |
| Example 3 | A-3 | PGMEA | 21.4 | 3.5 |
| Example 4 | A-4 | PGMEA | 14.9 | 4.2 |

TABLE 2-continued

| | (A) Component | Solvent | Width of microdomain structure (nm) | LWR (nm) |
|---|---|---|---|---|
| Example 5 | A-5 | PGMEA | 19.8 | 3.9 |
| Example 6 | A-6 | PGMEA | 29.5 | 3.4 |
| Comparative Example 1 | a-1 | PGMEA | 20.9 | 6.5 |
| Comparative Example 2 | a-2 | PGMEA | — | — |

As shown in Table 2, it was revealed that a sufficiently fine and favorable microdomain structure was obtained when the directed self-assembling compositions for pattern formation of Examples were used. According to the directed self-assembling compositions for pattern formation of Comparative Examples, phase separation during pattern formation was less likely to occur, and some of them resulted in failure to form the microdomain structure.

According to the embodiments of the present invention, a directed self-assembling composition for pattern formation enabling a pattern having a sufficiently fine and favorable microdomain structure to be formed, and a pattern-forming method in which the same is used can be provided. Therefore, the directed self-assembling composition for pattern formation and the pattern-forming method according to the embodiments of the present invention are suitably used in lithography processes in manufacture of various types of electronic devices such as semiconductor devices and liquid crystal devices for which further miniaturization has been demanded.

Obviously, numerous modifications and variations of the present invention are possible in light of the above teachings. It is therefore to be understood that within the scope of the appended claims, the invention may be practiced otherwise than as specifically described herein.

The invention claimed is:
1. A block copolymer comprising:
a polystyrene block comprising a styrene unit; and
a polyalkyl (meth)acrylate block comprising an alkyl (meth)acrylate unit,
the block copolymer comprising an organic group that is bound to at least one end of a main chain of the block copolymer and that comprises a hetero atom,
wherein a polymerization initiation end of the block copolymer comprises a structure derived from an alkyl lithium,
wherein the organic group included in the block copolymer comprises a nitrogen atom, a sulfur atom, a phosphorus atom, a tin atom, or a combination thereof, or is represented by formula (1):

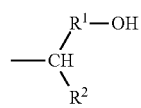

(1)

wherein, in the formula (1), $R^1$ represents a single bond or a divalent organic group having 1 to 30 carbon atoms; and $R^2$ represents a hydrogen atom, an aliphatic linear hydrocarbon group having 1 to 30 carbon atoms, an alicyclic hydrocarbon group having 3 to 30 carbon atoms, or a group in which the aliphatic linear hydrocarbon group having 1 to 30 carbon atoms or the alicyclic hydrocarbon group having 3 to 30 carbon atoms comprises a hetero atom between adjacent two carbon atoms, and
wherein the organic group is not a monomeric unit included in the block copolymer.

2. The block copolymer of claim 1, wherein the block copolymer is a diblock copolymer or a triblock copolymer.

3. The block copolymer of claim 1, wherein the block copolymer is a diblock copolymer.

4. The block copolymer of claim 1, wherein the organic group is bound to an end of the main chain of the polyalkyl (meth)acrylate block.

5. The block copolymer of claim 1, wherein the block copolymer is a diblock copolymer the organic group is bound to an end of the main chain of the polyalkyl (meth) acrylate block.

6. The block copolymer of claim 1, wherein the alkyl (meth)acrylate unit is a methyl methacrylate unit.

7. The block copolymer of claim 1, wherein a molar ratio of styrene units to alkyl (meth)acrylate units in the block copolymer is no less than 10/90 and no greater than 90/10.

8. The block copolymer of claim 1, wherein the organic group included in the block copolymer is derived from an epoxy compound.

9. The block copolymer of claim 1, wherein the hetero atom is a nitrogen atom, a sulfur atom, a phosphorus atom, a tin atom or a combination thereof.

10. The block copolymer of claim 1, wherein $R^1$ represents a divalent organic group having 2 to 30 carbon atoms.

11. The block copolymer of claim 1, wherein $R^1$ represents an aliphatic linear hydrocarbon group having 2 to 30 carbon atoms and optionally comprising a hetero atom between adjacent two carbon atoms, an alicyclic hydrocarbon group having 3 to 30 carbon atoms and optionally comprising a hetero atom between adjacent two carbon atoms, or an aromatic hydrocarbon group having 6 to 30 carbon atoms and optionally comprising a hetero atom between adjacent two carbon atoms.

12. The block copolymer of claim 1, wherein the organic group included in the block copolymer is represented by the formula (1).

13. The block copolymer of claim 12, wherein $R^1$ represents a divalent organic group having 2 to 30 carbon atoms.

14. The block copolymer of claim 12, wherein $R^1$ represents an aliphatic linear hydrocarbon group having 2 to 30 carbon atoms and optionally comprising a hetero atom between adjacent two carbon atoms, an alicyclic hydrocarbon group having 3 to 30 carbon atoms and optionally comprising a hetero atom between adjacent two carbon atoms, or an aromatic hydrocarbon group having 6 to 30 carbon atoms and optionally comprising a hetero atom between adjacent two carbon atoms.

* * * * *